United States Patent
Pedersen et al.

(10) Patent No.: US 12,167,207 B2
(45) Date of Patent: Dec. 10, 2024

(54) ELECTRONIC MODULE FOR A HEARING DEVICE

(71) Applicant: Oticon A/S, Smørum (DK)

(72) Inventors: Troels Holm Pedersen, Smørum (DK); Søren Wichmann, Smørum (DK); Dennis Presutti, Smørum (DK)

(73) Assignee: Oticon A/S, Smørum (DK)

( * ) Notice: Subject to any disclaimer, the term of this patent is extended or adjusted under 35 U.S.C. 154(b) by 0 days.

(21) Appl. No.: 18/489,101

(22) Filed: Oct. 18, 2023

(65) Prior Publication Data

US 2024/0048924 A1 Feb. 8, 2024

Related U.S. Application Data

(63) Continuation of application No. 17/872,804, filed on Jul. 25, 2022, now Pat. No. 11,825,274, which is a continuation of application No. 17/126,780, filed on Dec. 18, 2020, now Pat. No. 11,438,718.

(30) Foreign Application Priority Data

Dec. 21, 2019 (EP) ..................................... 19219179
Dec. 21, 2019 (EP) ..................................... 19219180

(51) Int. Cl.
*H04R 25/00* (2006.01)
*H05K 5/06* (2006.01)

(52) U.S. Cl.
CPC ......... *H04R 25/658* (2013.01); *H04R 25/609* (2019.05); *H05K 5/065* (2013.01)

(58) Field of Classification Search
CPC .............................. H04R 25/658; H04R 25/65
USPC ................................ 381/312, 322, 324, 325
See application file for complete search history.

(56) References Cited

U.S. PATENT DOCUMENTS

| | | |
|---|---|---|
| 6,249,587 B1 | 6/2001 | Clavadetscher et al. |
| 2013/0129127 A1 | 5/2013 | Wagner et al. |
| 2020/0196075 A1 | 6/2020 | Thasapparaj et al. |

FOREIGN PATENT DOCUMENTS

| | | |
|---|---|---|
| EP | 3 668 119 A1 | 6/2020 |
| JP | 60-244506 A | 12/1985 |
| WO | WO 2014/044291 A1 | 3/2014 |

*Primary Examiner* — George C Monikang
(74) *Attorney, Agent, or Firm* — Birch, Stewart, Kolasch & Birch, LLP

(57) ABSTRACT

The present disclosure relates to an electronic module for a hearing device. The electronic module comprises at least one electronic component for a hearing device and an embedding material covering the electronic component. The electronic component comprises at least one restricted area which is free from the embedding material. The restricted area is surrounded at least partially by a zone and the zone is covered by an attaching material. The attaching material covering the zone has a mold part formed by molding and freely formed edge facing the restricted area.

18 Claims, 12 Drawing Sheets

ELECTRONIC MODULE FOR A HEARING DEVICE

CROSS-REFERENCE TO RELATED APPLICATION

This non-provisional application is a Continuation of copending application Ser. No. 17/872,804, filed on Jul. 25, 2022, which is a Continuation of application Ser. No. 17/126,780, filed on Dec. 18, 2020 (now U.S. Pat. No. 11,438,718, issued Sep. 6, 2022), which claims priority under 35 U.S.C. § 119(a) to patent application Ser. No. 19/219,180.7 filed in the European Patent Office on Dec. 21, 2019 and patent application Ser. No. 19/219,179.9 filed in the European Patent Office on Dec. 21, 2019, all of which are hereby expressly incorporated by reference into the present application.

FIELD

The present disclosure relates to an electronic module for a hearing device. More particularly, the disclosure relates to an electronic module for a hearing aid. The present disclosure relates to method of manufacturing an electronic module for a hearing device, especially for a hearing aid. Further, the present disclosure relates to a hearing aid comprising the electronic module according to the present disclosure.

BACKGROUND

In the field of hearing devices, especially hearing aids, one of the issues is protection of hearing device, especially electronic parts of the device against dirt and moisture and at the same time making the device being resistant to ESD. Moreover, when providing a structure of the hearing device, one of issue is size and weight of the hearing device. This means that a structure of a device which provides protection against dirt and moisture and ESD protection, should not lead to increasing size and/or weight of the hearing device. Thus, there is a need in the field of hearing device field to improve properties of the hearing device without increasing size and/or weight.

In state of the art covering a surface of an electronic element with a protective and/or insulating material is known as a method for providing protection of electronic element. However, in known solutions only some sides are covered with the insulation material, thus providing only partial protection of an electronic element. This is because electronic elements have some functional parts, like for example microphone port or contact pad, to which a free access is provided in order to use the functional parts for intended purpose. Thus, in state of the art there is a need to provide an electronic element having only some parts not covered by insulation material and at the same time providing the remaining surface of an electronic element covered by the protection material.

Therefore, there is a need to provide a solution that addresses at least some of the above-mentioned problems.

SUMMARY

According to an aspect of the disclosure, an electronic module for a hearing device is provided. The electronic module may comprise at least one electronic component for a hearing device and an embedding material covering the electronic component. The electronic component may comprise at least one restricted area which is free from the embedding material. The restricted area may be surrounded at least partially by a zone and the zone is covered by an attaching material. The attaching material covering the zone may have mold part formed by molding and freely formed edge facing the restricted area.

The embedding material form a kind of capsule for an electronic component with restricted area which is not covered by an embedding material. Therefore, the embedding material encapsulates the electronic component. The embedding material provides a protection of a hearing device against influence of external environment and at the same time allows for access to intended parts of the electronic component. This is especially important in the field of hearing aids. Since the embedding material covers the electronic component, there is no need to provide a separate element for protecting the electronic component against dirt and moisture. Since the electronic module comprises a restricted area free from embedding material, therefore an access to some parts of the electronic component is provided and the parts can be used in the intended way while the all remaining surface is covered by embedding material. Since the embedding material covers surface of an electronic module excluding a restricted area, a surface of the electronic component covered with the embedding material is protected from moisture and dirt, for example the battery poles. Moreover, the electronic module according to the disclosure provides improved electrostatic discharge (ESD) performance of a device where the module will be used. This means that it is possible to simplify design of the device since less other means for ESD protection is needed. In case the electronic module comprises more than one component, the embedding material connect the components relative to each other. The embedding material may not only connect components of the electronic module, but also may fix the components with respect to each other. The embedding of the electronic component may be performed for example by encapsulation, molding, transfer molding, injection molding, overmolding, potting and any other known methods which allows for covering an object with an embedding material which is cured or solidified in contact with a component, preferably electronic component. Embedding material is solidifying material. The solidifying material may be for example epoxy, like for example silicon, polyurethane, thermoset material or thermoplastic material. The embedding material has preferably at least one of the following properties: low viscosity before solidification, low shrinkage, is suitable for embedding, UV curing, heat curing, contact to skin, heat conducting, dielectric, transparent, translucent, non-transparent, electrical insulating, electrical conducting, flexible, rigid, low thermal expansion.

Preferably, the embedding material encapsulates the electronic component. This means that excluding the at least one restricted area the whole surface of the electronic component is covered with the embedding material.

The electronic module may comprise the attaching material is a sealing material.

Using a sealing material allows to use a sealing material having desired adhesive and sealing properties just for attaching a mask element to an electronic component.

The electronic module may comprise the attaching material is the embedding material.

When using embedding material as attaching material surface simplifies the structure of the module.

The embedding material may form external surface of the electronic module and the zone forms at least part of a bottom of a recess in the external surface of the encapsulated electronic module.

The embedding material may form the external surface of the electronic module.

The recess may be used as a mounting element for a part of a hearing device.

The electronic module may comprise the zone is arranged on a protruding part of the electronic module.

The electronic module may comprise at least two electronic components and the embedding material may attach the components relative to each other.

The embedding material covers an electronic component and connect the components with respect to each other. The embedding material can fix components with respect to each other. When the components are connected by the embedding material, the embedding material perform a function of mounting element, like for example perform a function of a rack. Therefore, a need of providing a rack is eliminated. Moreover, embedding is especially advantageous for heavy parts of a hearing device because the heavy parts are especially exposed to damages when a hearing device is for example dropped. Since the embedding material covers the whole surface of the electronic components the components are attached more stable and a layer of an embedding material perform a function of protective element as such. Since embedding provides that electronic components are trapped in the embedding material and the embedding material fills gaps between the components, no underfill of ICs or other electronic parts on PCB needed.

The electronic module may comprise a PCB folded into a three-dimensional shape so that the PCB suitable for a hearing aid.

The electronic module comprises an element which can be arranged in any desired way with respect to each other. When the electronic module is folded into a three-dimensional shape which is suitable for a hearing aid, the arrangement of components of the hearing aid is adjusted to a shape of a hearing device.

According to another aspect, hearing aid comprising the encapsulated electronic module according to the disclosure is provided.

Since the electronic component are embedded in the embedding material, the electronic components are protected from dirt and moisture. Thus, there is no need to provide further protection in the hearing device. Moreover, there is no need to provide a rack. The hearing device is lighter due to elimination of using a rack and an element providing protection from dirt and moisture of the electronic component.

According to another aspect, a method of manufacturing an electronic module for a hearing device is provided. The method comprises providing at least one electronic component for an electronic module. The method may comprise attaching a mask element to the electronic component. A cavity between the mask element and the electronic component may be provided. The method may comprise embedding the electronic component in an embedding material.

Since a mask element is attached to an electronic component, a surface of the electronic component is prevented from being covered with embedding material. A cavity between the mask element and the electronic component provides a capillary stop for the attaching material thus preventing entering the attaching material to a restricted area and preventing embedding material from entering the restricted area. The embedding of the electronic component may be performed for example by encapsulation, molding, transfer molding, injection molding, overmolding, potting and any other known methods which allows for covering an object with an embedding and/or curable and/or solidifying material which is cured or solidified in contact with and/or on or around an electronic component.

The mask element may comprise the cavity.

When a mask element comprises a cavity, the mask element can be used with at many types of surfaces of the electronic component. The mask element can be reused. Moreover, when the mask element is provided with a cavity, the mask element can be feely chosen for every specific application matched to shape and type of the electronic component and/or properties of embedding material and/or features of the electronic module we want to obtain.

The electronic component may comprise the cavity.

When a cavity is provided in an electronic component, a mask element which is used in the method does may be flat and therefore improved pressing the mask element to the electronic component can be achieved. Moreover, when a mask element will be left in an encapsulated electronic module after curing, a top surface of the mask element can be even with external surface of the encapsulated electronic component formed by encapsulation material.

The attaching may be performed with an attaching substance or attaching member.

Attaching element or attaching member provides that a mask element is fixed to the electronic component in desired place, namely over a restricted area. Both attaching element or attaching member provides that the embedding material does not enter to the restricted area.

The attaching may be performed with a sealing material as the attaching material.

The attaching is performed with the encapsulation material as attaching material.

The embedded electronic module may comprise at least two electronic components and the embedding material fix the components relative to each other.

The method may comprise removing the mask element from the encapsulated electronic module.

The restricted area may comprise a protruding part and the method comprises sealing the mask element to the protruding part.

The restricted area may comprise a functional element, for example microphone inlet and/or connector and/or switch and/or PCB and/or LED and/or lightguide and/or speaker outlet and/or an (optical) sensor and/or a skin electrode and/or opening or a serial number sticker.

The method may comprise providing a spring element for decreasing a gap between the mask element and the electronic component.

According to another aspect of the disclosure, a method of manufacturing an object embedded in a solidified material and a device for performing the method are provided.

In the field of methods for covering an object with a material in liquid state which is solidified afterwards, there is a need to provide a method which allows removing air form the mold cavity, thus providing maximized filling of the mold cavity with solidifying and minimize presence and size of air bubbles present in the material. This is especially important in applications where an object which need to be covered has complex shape. In such a case there is a risk that air bubbles are trapped somewhere within the object, for example the air bubbles are trapped in a cavity or just in an unevenness of a surface of an object. This issue is especially important for objects which are covered with relatively thin layer of a material. In such a case, an issue of avoiding and/or reducing size of air bubbles in embedding material is important, because in thin layer, an air bubble may cause interruption of the embedding material. This is especially important for electronic devices, especially devices comprising electronic components and being designed for being used in environment where dirt and moisture is present, like for example hearing devices. In the field of hearing devices one of the issues is protection of electronic parts of the device against dirt and moisture and at the same time making the device being resistant to electro static discharge (ESD). Moreover, when providing a structure of the hearing device, especially hearing aid, one issue is size and weight of the hearing device. This means that a structure of a device which provides protection against dirt and moisture and ESD protection, should not lead to increasing size and/or weight of the hearing device. Thus, there is a need in the field of hearing device field to improve properties of the hearing device without increasing size and/or weight.

In state of the art covering a surface of an object with a solidifying material is known. However, in state of the art there is a need to provide a method for embedding an object providing minimized amount of air in embedding material. Therefore, there is a need to provide a solution that addresses at least some of the above-mentioned problems.

According to an aspect of the disclosure a method of manufacturing an object embedded in a solidified material is provided. The method comprises providing an object for embedding in a mold cavity. The mold cavity may have closed volume. The method may comprise initial filling of the mold cavity and at least one reservoir with a solidifying material. The method may comprise supplementary filling the mold cavity with the solidifying material from the at least one reservoir. The method may comprise solidifying the solidifying material embedding the object.

The method according to the disclosure provides that a mold cavity and a reservoir of solidifying material are filled with a solidifying material at the same time. Solidifying material should be understood as a material in contact with the object. Solidifying may be performed as a reaction or/and phase change, therefore solidifying may be for example curing, phase changing, vulcanizing or crosslinking or etc. Initial filling is first stage of the method and ends when solidifying material is no longer introduced to the mold cavity and to the reservoir from a dispensing system of the solidifying material, for example from a nozzle.

Therefore, in the method the solidifying material is supplied to the mold cavity and to the reservoir in one operation. During the initial filling the solidifying material fills the mold cavity and at least one reservoir. Once initial filling is finished, new solidifying material may not be supplied by a dispensing system. At this moment the mold cavity comprises solidifying material and air bubbles. The air bubbles may be released by for example vibration, and/or minimized in size by changing pressure or changing temperature or a combination of the above mentioned. As result of this releasing and/or shrinking of the air bubbles, a void space/gaps in the mold cavity are created. This voids space/gaps are filled by solidifying material form the reservoir during supplementary filling.

Since during the initial filling, the solidifying material is collected in the at least one reservoir, the material may be supplied to the mold cavity from the at least one reservoir. The reservoir may provide access of the solidifying material to the mold cavity. The method according disclosure allows that filing of the mold cavity may be continued after the supplying of solidifying material from dispensing system has ended.

Therefore, no filling means like for example a nozzle is needed during supplementary filling. This allows time saving since a solidifying material for supplementary filling is collected in the reservoir and is ready to be used while a nozzle supplying the material may be moved to next mold cavity. The method according to the disclosure may be potting method, encapsulation method, injection molding method, overmolding method or any other known method which allows to embed an object in a solidifying material which is solidified in contact with the object.

Method according to the disclosure allows control of a geometry of an object embedded in the solidifying material on all sides, for example all six sides, i.e. bottom, left, right, front, back and top of the object, which is advantageous in compare to known prior art solutions.

The solidifying material for the supplementary filling may be supplied to the at least one reservoir by an initial filling means.

When solidifying material is supplied the reservoir by the initial filling means one source of solidifying material are used in the method.

The reservoir can have may have any shape e.g. a thick tube, runner, with an accumulated solidifying material.

The solidifying material may, during the supplementary filling be introduced to the mold cavity at a point where the solidifying material is introduced during the initial filling.

A such design would simplify the mold cavity and leave fewer processing marks on the final part (if the supplementary filling and the initial filling took place though two different points, it would leave two gate remain marks on the final part—instead of just one.

The supplementary filling may comprise introducing the solidifying material to the mold cavity at least at one extreme point of the mold cavity, the at least one extreme point is a point in the mold cavity which the solidifying material reach during initial filling thus completing filling a volume of the mold cavity.

The technical effect of introducing the material at an extreme point is that the extreme points in a mold is often the hardest ones to fill—either due to the trap air or due to a lack of material flow in the area (a dead end for the material)—therefore it is a good idea to put the material introduction point here, since we are then sure that these extreme points are filled.

In the method there may be provided at least one inspection hole at an extreme point or adjacent to the extreme point, wherein the extreme point is a point in the mold cavity which the solidifying material reach during initial filling and thus completing filling a volume of the mold cavity.

The inspection hole may allow visual check of the inside of the mold cavity. Moreover, the inspection hole is also a venting hole. The inspection hole may also be used as a reservoir (reservoir).

The supplementary filling may be performed at higher pressure than the pressure of the initial filling.

When supplementary filling is performed at higher pressure than initial filling, for example, the initial filling is performed in a vacuum and the supplementary filling is performed at atmospheric pressure or above, for example 5 bar or 10 bar, air bubbles entrapped in the cavity mold during the initial filling are minimized once pressure is increased to the atmospheric pressure. This is advantageous, since air bubbles are minimized, whereas the presence and size of air bubbles may negatively affect performance of the embedded object. Therefore, reduction of size of the air bubbles improves performance. The pressure for performing initial filling or supplementary filling or solidifying may be obtained by changing a pressure in the mold cavity or by placing the mold cavity in a pressure chamber.

The supplementary filling pressure may be as high as possible above the initial filling pressure.

Reduction of size of the air bubbles may advantageously affect the visual appearance of the embedded object, which may be relevant for products where an embedded object is not covered with shells.

Reduction of size of the air bubbles may affect the reliability. Especially air bubbles can enable corrosion due to moisture go through the air bubbles and lessen structural strength of solidifying material. Reduction of size of the air bubbles reduces the risk of corrosion.

Moreover, air bubbles may furthermore deflect light from entering of exiting the encapsulated object—e.g. light from an encapsulated LED, or light to an optical sensor, like e.g. a camera, colour sensor, light intensity sensor.

The solidifying may be performed at higher pressure than the pressure of the initial filling.

The initial filling may be performed in vacuum.

When performing first step, namely initial filling in a vacuum, it is possible to achieve the biggest possible size difference between the air bubbles while entrapped and the air bubbles while solidification.

The initial filling and/or the supplementary filling may be performed gravitationally.

When the filling is performed gravitationally, amount of energy required for performing the method is minimized.

When the mold cavity is filled gravitationally, this lowers the complexity in the filling equipment, since dispensing of the solidifying material may be continued without a pump after initial filling—thereby there is no need for a precision pump for each mold for the simultaneous filling and the supplementary filling.

Gravity provides enough to reach the low filling pressures and filling speeds which are suitable for embedding the fragile electronics, like electronic elements of a hearing aid.

The object may comprise at least one electronic component of a hearing aid.

According to an aspect of the disclosure a device for manufacturing an object embedded in a solidifying material is provided. The device comprises a mold cavity. The device may comprise initial filling means for initial filling the mold cavity and at least one reservoir for the solidifying material. The at least one reservoir may be connected with the mold cavity for supplementary filling the mold cavity with the solidifying material.

The device according to the disclosure allows topping up the mold cavity from the reservoir. The device allows saving time, since the solidifying material is supplied to the device, namely to the initial filling means and the reservoir in one shot. Therefore, after the material is supplied to the device, the filling means, like for example a nozzle, may be moved to a next cavity mold.

A device for manufacturing an object embedded in a solidified material, may comprise the at least one reservoir connected with the mold cavity at least at one extreme point of the mold cavity. The at least one extreme point is a point which the solidifying material reach during initial filling and thus completing filling a volume of the mold cavity.

A device for manufacturing an object embedded in a solidified material may comprise an opening for inspection and/or for venting the mold cavity at the extreme point or adjacent to the extreme point, the at least one extreme point is a point in the mold cavity which the solidifying material reach thus completing filling in the mold cavity during initial filling.

The opening for venting in the top of the cavity, can also be used double as a reservoir—and thereby not leave an excessive amount of marks on the final part.

The device may comprise an opening for inspection and/or for venting the mold cavity at an extreme point or adjacent to an extreme point, the at least one extreme point is a point in the mold cavity which the solidifying material reach thus completing filling a volume of the mold cavity during initial filling.

A device for manufacturing an object embedded in a solidified material may comprise an opening for inspection and/or for venting the mold cavity at an extreme point or adjacent to an extreme point, the at least one extreme point is a point in the mold cavity which the solidifying material reach thus closing a volume of the mold cavity during initial filling.

The reservoir may be arranged along a channel for introducing the solidifying material for the initial filling.

The device may comprise at least one arranged so that the solidifying material fills the mold cavity gravitationally.

According to some embodiments of the aspect, there is provided:

A method of manufacturing an object embedded in a solidified material comprising:
 providing an object for embedding in a mold cavity,
 the mold cavity is closed volume,
 initial filling of the mold cavity and at least one reservoir with a solidifying material,
 supplementary filling the mold cavity with the solidifying material from the at least one reservoir,
 solidifying the solidifying material embedding the object.

A method of manufacturing an object embedded in a solidified material wherein the solidifying material for the supplementary filling is supplied to the at least one reservoir by an initial filling means.

A method of manufacturing an object embedded in a solidified material wherein the solidifying material during the supplementary filling is introduced to the mold cavity at a point where the solidifying material is introduced during the initial filling.

A method of manufacturing an object embedded in a solidified material wherein in the supplementary filling comprises introducing the solidifying material to the mold cavity at least at one extreme point of the mold cavity, the at least one extreme point is a point in the mold cavity which the solidifying material reach during initial filling thus completing filling the volume of the mold cavity.

A method of manufacturing an object embedded in a solidified material wherein there is provided at least one inspection hole at an extreme point or adjacent to the extreme point, wherein the extreme point is a point in the mold cavity which the solidifying material reach during initial filling and thus completing filling a volume of the mold cavity.

A method of manufacturing an object embedded in a solidified material wherein the supplementary filling is performed at higher pressure than the pressure of the initial filling.

A method of manufacturing an object embedded in a solidified material wherein the solidifying is performed at higher pressure than the pressure of the initial filling.

A method of manufacturing an object embedded in a solidified material wherein the initial filling is performed in a vacuum.

A method of manufacturing an object embedded in a solidified material wherein the initial filling and/or the supplementary filling is performed gravitationally.

A method of manufacturing an object embedded in a solidified material wherein the object comprises at least one electronic component for a hearing aid.

A device for manufacturing an object embedded in a solidified material comprising:
a mold cavity,
initial filling means for initial filling the mold cavity and at least one reservoir for the solidifying material,
the at least one reservoir connected with the mold cavity for supplementary filling the mold cavity with the solidifying material.

A device for manufacturing an object embedded in a solidified material, wherein the at least one reservoir is connected with the mold cavity at least at one extreme point of the mold cavity, the at least one extreme point is a point which the solidifying material reach during initial filling and thus completing filling a volume of the mold cavity.

A device for manufacturing an object embedded in a solidified material, comprising an opening for inspection and/or for venting the mold cavity at an extreme point or adjacent to an extreme point, the at least one extreme point is a point in the mold cavity which the solidifying material reach thus completing filling a volume of the mold cavity during initial filling.

A device for manufacturing an object embedded in a solidified material wherein the reservoir is arranged along a channel for introducing the solidifying material for the initial filling.

A device for manufacturing an object embedded in a solidified material wherein the at least one reservoir is arranged so that the solidifying material fills the mold cavity gravitationally.

BRIEF DESCRIPTION OF DRAWINGS

The aspects of the disclosure may be best understood from the following detailed description taken in conjunction with the accompanying figures. The figures are schematic and simplified for clarity, and they just show details to improve the understanding of the claims, while other details are left out. Throughout, the same reference numerals are used for identical or corresponding parts. The individual features of each aspect may each be combined with any or all features of the other aspects. These and other aspects, features and/or technical effect will be apparent from and explained with reference to the illustrations described hereinafter in which:

DETAILED DESCRIPTION

Figure 1:
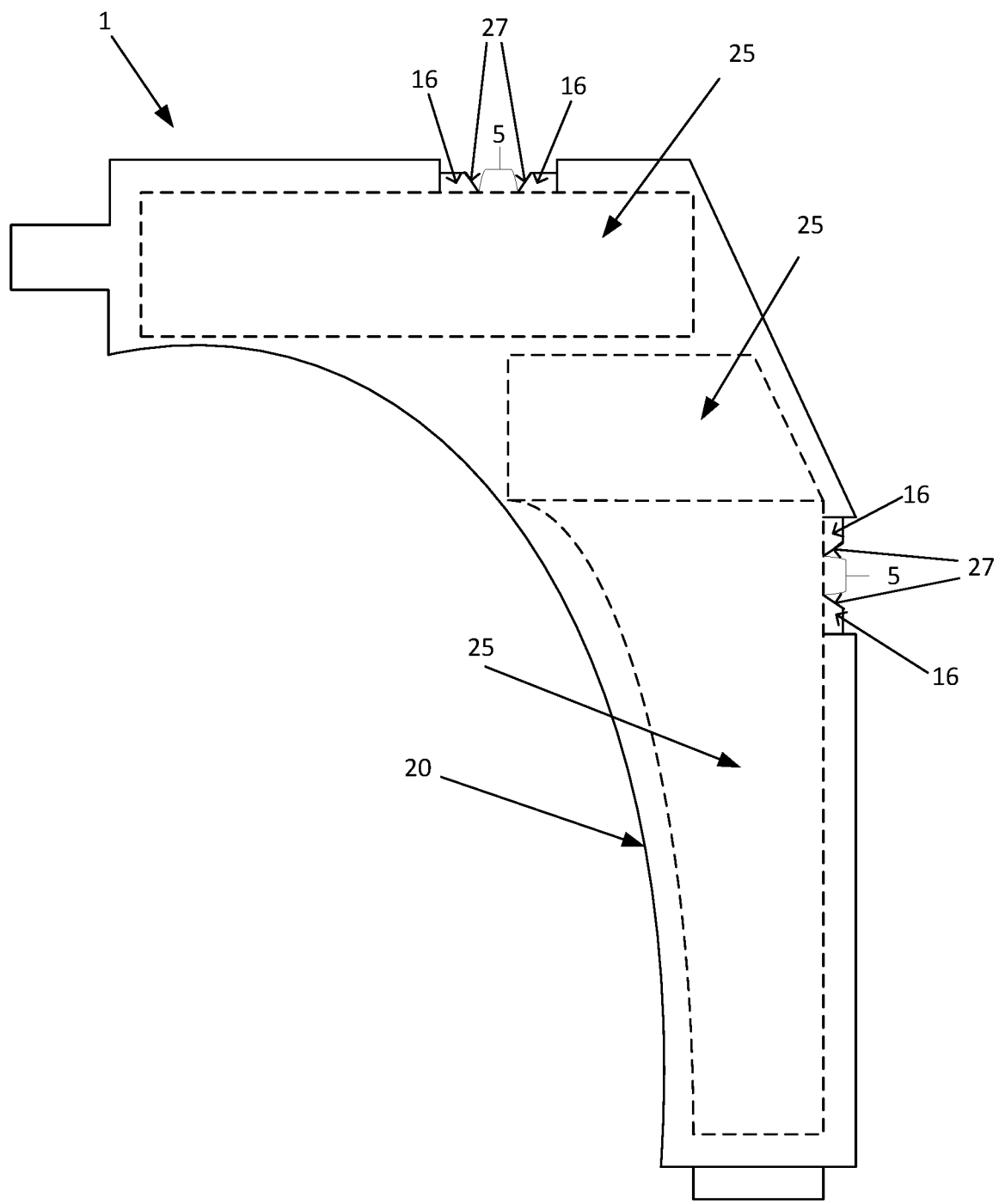
FIG. 1 electronic module.

The detailed description set forth below in connection with the appended drawings is intended as a description of various configurations. The detailed description includes specific details for the purpose of providing a thorough understanding of various concepts. However, it will be apparent to those skilled in the art that these concepts may be practiced without these specific details. Several aspects of the apparatus and methods are described by various blocks, functional units, modules, components, circuits, steps, processes, algorithms, etc. (collectively referred to as "elements"). Depending upon particular application, design constraints or other reasons, these elements may be implemented using electronic hardware, computer program, or any combination thereof. The electronic hardware may include micro-electronic-mechanical systems (MEMS), integrated circuits (e.g. application specific), microprocessors, microcontrollers, digital signal processors (DSPs), field programmable gate arrays (FPGAs), programmable logic devices (PLDs), gated logic, discrete hardware circuits, printed circuit boards (PCB) (e.g. flexible PCBs), and other suitable hardware configured to perform the various functionality described throughout this disclosure, e.g. sensors, e.g. for sensing and/or registering physical properties of the environment, the device, the user, etc. Computer program shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

A hearing device (or hearing instrument, hearing assistance device) may be or include a hearing aid that is adapted to improve or augment the hearing capability of a user by receiving an acoustic signal from a user's surroundings, generating a corresponding audio signal, possibly modifying the audio signal and providing the possibly modified audio signal as an audible signal to at least one of the user's ears. 'Improving or augmenting the hearing capability of a user' may include compensating for an individual user's specific hearing loss. The "hearing device" may further refer to a device such as a hearable, an earphone or a headset adapted to receive an audio signal electronically, possibly modifying the audio signal and providing the possibly modified audio signals as an audible signal to at least one of the user's ears. Such audible signals may be provided in the form of an acoustic signal radiated into the user's outer ear, or an acoustic signal transferred as mechanical vibrations to the user's inner ears through bone structure of the user's head and/or through parts of the middle ear of the user or electric signals transferred directly or indirectly to the cochlear nerve and/or to the auditory cortex of the user.

The hearing device is adapted to be worn in any known way. This may include i) arranging a unit of the hearing device behind the ear with a tube leading air-borne acoustic signals into the ear canal or with a receiver/loudspeaker arranged close to or in the ear canal and connected by conductive wires (or wirelessly) to the unit behind the ear, such as in a Behind-the-Ear type hearing aid, and/or ii) arranging the hearing device entirely or partly in the pinna and/or in the ear canal of the user such as in an In-the-Ear type hearing aid or In-the-Canal/Completely-in-Canal type hearing aid, or iii) arranging a unit of the hearing device attached to a fixture implanted into the skull bone such as in a Bone Anchored Hearing Aid or a Cochlear Implant, or iv) arranging a unit of the hearing device as an entirely or partly implanted unit such as in a Bone Anchored Hearing Aid or a Cochlear Implant. The hearing device may be implemented in one single unit (housing) or in a number of units individually connected to each other.

A "hearing system" refers to a system comprising one or two hearing devices, and a "binaural hearing system" refers to a system comprising two hearing devices where the devices are adapted to cooperatively provide audible signals to both of the user's ears. The hearing system or binaural hearing system may further include one or more auxiliary device(s) that communicates with at least one hearing device, the auxiliary device affecting the operation of the hearing devices and/or benefitting from the functioning of the hearing devices. A wired or wireless communication link between the at least one hearing device and the auxiliary device is established that allows for exchanging information (e.g. control and status signals, possibly audio signals) between the at least one hearing device and the auxiliary device. Such auxiliary devices may include at least one of a remote control, a remote microphone, an audio gateway device, a wireless communication device, e.g. a mobile phone (such as a smartphone) or a tablet or another device, e.g. comprising a graphical interface, a public-address system, a car audio system or a music player, or a combination thereof. The audio gateway may be adapted to receive a multitude of audio signals such as from an entertainment device like a TV or a music player, a telephone apparatus like a mobile telephone or a computer, e.g. a PC. The auxiliary device may further be adapted to (e.g. allow a user to) select and/or combine an appropriate one of the received audio signals (or combination of signals) for transmission to the at least one hearing device. The remote control is adapted to control functionality and/or operation of the at least one hearing device. The function of the remote control may be implemented in a smartphone or other (e.g. portable) electronic device, the smartphone electronic device possibly running an application (APP) that controls functionality of the at least one hearing device.

In general, a hearing device includes i) an input unit such as a microphone for receiving an acoustic signal from a user's surroundings and providing a corresponding input audio signal, and/or ii) a receiving unit for electronically receiving an input audio signal. The hearing device further includes a signal processing unit for processing the input audio signal and an output unit for providing an audible signal to the user in dependence on the processed audio signal.

The input unit may include multiple input microphones, e.g. for providing direction-dependent audio signal processing. Such directional microphone system is adapted to (relatively) enhance a target acoustic source among a multitude of acoustic sources in the user's environment and/or to attenuate other sources (e.g. noise). In one aspect, the directional system is adapted to detect (such as adaptively detect) from which direction a particular part of the microphone signal originates. This may be achieved by using conventionally known methods. The signal processing unit may include an amplifier that is adapted to apply a frequency dependent gain to the input audio signal. The signal processing unit may further be adapted to provide other relevant functionality such as compression, noise reduction, etc. The output unit may include an output transducer such as a loudspeaker/receiver for providing an air-borne acoustic signal transcutaneously or percutaneously to the skull bone or a vibrator for providing a structure-borne or liquid-borne acoustic signal. In some hearing devices, the output unit may include one or more output electrodes for providing the electric signals such as in a Cochlear Implant.

FIG. 1 shows an electronic module 1 for a hearing aid according to the disclosure. The electronic module comprises electronic components 25. The electronic module shown in FIG. 1 is suitable for behind the ear hearing aid. The electronic module shown in FIG. 1 comprises the following electronic components: a microphone, a speaker, a battery, a connector thus, in this example of the disclosure, the electronic module comprises basic components of an exemplary hearing aid. The battery may be rechargeable or chargeable.

The electronic module 1 shown in FIG. 1 comprises two restricted areas 5. The restricted areas 5 are parts of surface of electronic component 25 not covered by the embedding material. The restricted areas 5 are free from embedding material. This allows an access to the electronic component 25. Each restricted area 5 is surrounded by a zone 16 made of attaching material, which also can be seen in detail in top view in FIG. 3. The zone 16 has a mold part 29 and an edge 27. The edge 27 is a rim of the zone 16 facing the restricted area 5. The mold part 29 is formed by molding. The edge 27 is freely formed by embedding material. The remaining surface of the module 1 excluding restricted areas 5 is covered by the embedding material 3. Therefore, only parts of surface of the electronic component to which an access is needed are not covered with the embedding material 3.

The electronic module 1 according to the disclosure has a layer of embedding material 3 covering the electronic component 25 excluding the restricted areas 5. The embedding material 3 is preferably solidifying material, like for example epoxy, like for example silicon, polyurethane, thermoset material or thermoplastic material. The embedding material has preferably at least one of the following properties: is suitable for overmolding, is UV curable, is heat curable, is suitable for contact to skin of a user, is heat conducting, is low dielectric, is transparent, is translucent. The embedding material may be liquid.

The embedding material 3 forms an external surface 20 of the electronic module 1. Moreover, the embedding material fills gaps, spaces or cavities between and/or in electronic components 25. This is for example when shape or surface of the electronic component 25 is complex or just not even. Thus, the embedding material forms external shape of the electronic module 1. The embedding material 3 connects electronic components 25 with each other. Since the components 25 are trapped in the embedding material 3, the mutual arrangement of the electronic components 25 with respect to each other is established. Depending on properties of the embedding material 3, there is possibility of relative movement of the electronic components 25 in extent resulting from properties of the embedding material 3 and properties and arrangement of the electronic components 25. Since the electronic components 25 are fixed by the embedding material 3, the electronic components 25 are mounted and there is no need to provide a rack in a device for which the electronic module 1 is intended to use. The component may be fixedly mounted by the embedding material. Moreover, the embedding material 3 provides a protection of the electronic components 25 against mechanical damages. The mechanical damages are especially harmful for so called "heavy parts", like a telecoil and/or NFMI coil. Since the embedding material 3 perform the function of a rack, therefore, there is no need to use a rack in such a hearing device. This means that the material 3 provides a structural integrity of the hearing device. When a rack is eliminated, reduction of weight and/or dimensions of a hearing device is achieved.

Figure 2:
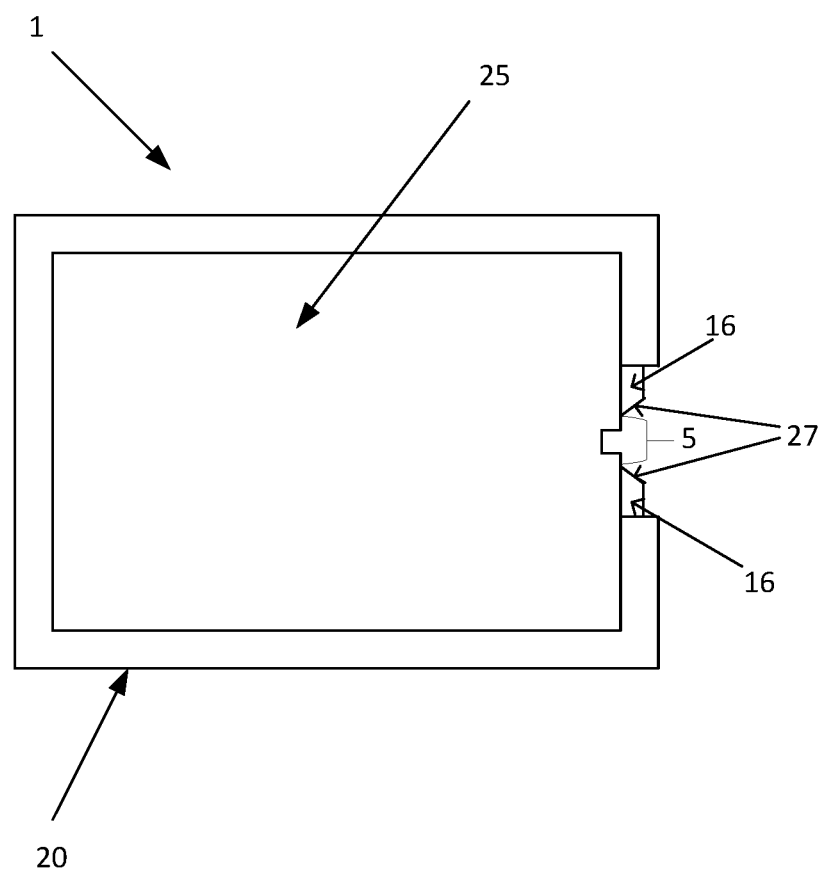
FIG. 2 electronic module.

An example of an electronic component 25 is as shown in FIG. 2. The electronic component 25 can be for example a microphone. The electronic component may be any other component suitable for a hearing device, especially for a hearing aid, like a speaker or PCB or telecoil or near link coil or connectors or battery. The electronic module 1 can comprise any combination of the electronic components mentioned above. Moreover, the electronic component may also comprise at least one a non-electronic component.

The electronic module 1 is shaped so that suitable parts of a hearing device can be mounted to the electronic module 1. Since the restricted area 5 has limited surface, which is adjusted to surface of a parts which are to be mounted to the restricted area 5, therefore the restricted area 5 is connected with an intended parts of the hearing device, thus providing tightness of the device. Since the embedding material 3 covers the at least one electronic component but without the restricted area 5, the embedding material 3 provides that the at least one electronic component is protected from moisture and dirt. Moreover, the at least one electronic component 1 when is covered with the embedding material 3, has improved ESD performance.

Figure 4:
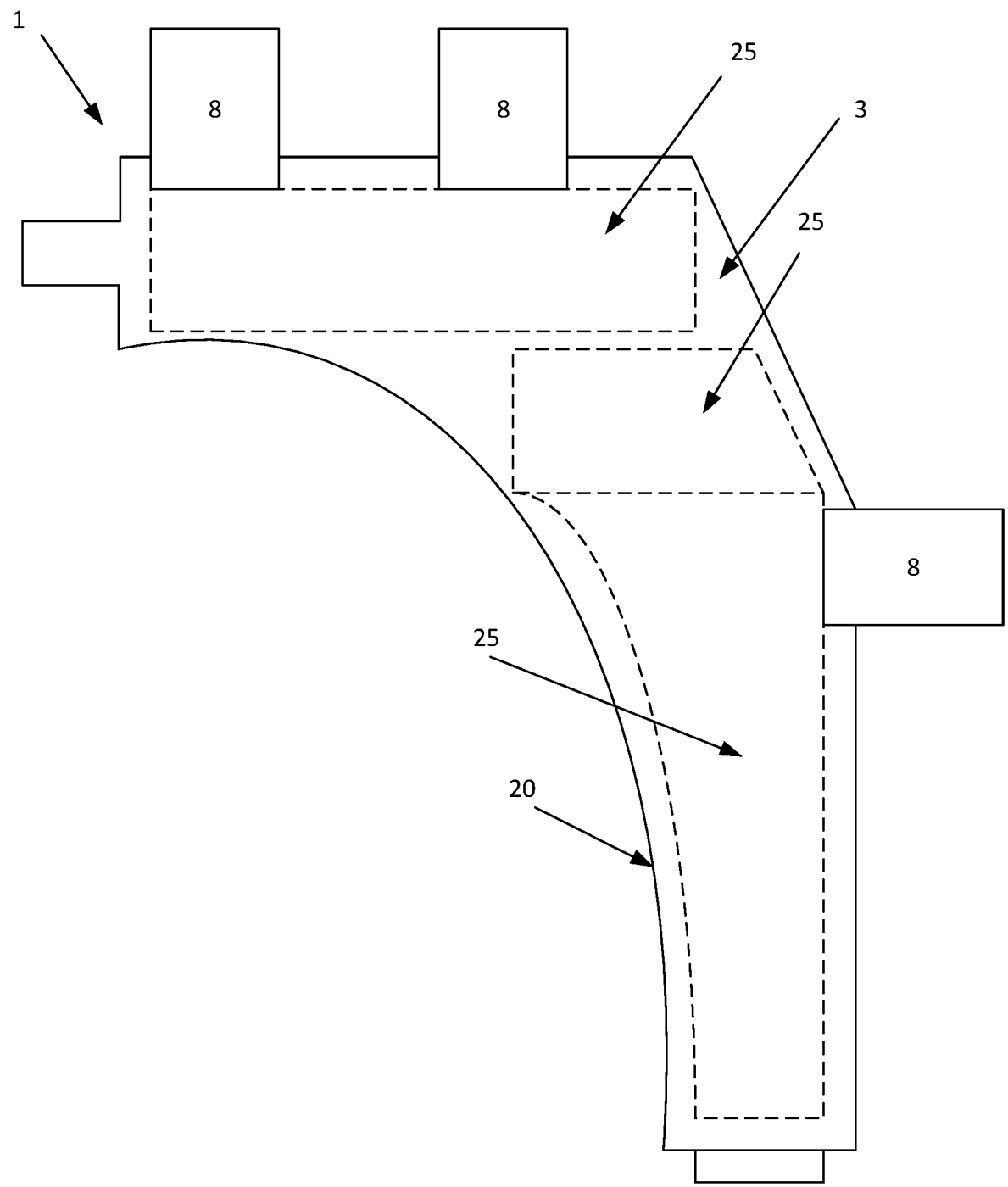
FIG. 4 electronic module with a mask element.

The electronic module 1 comprises a microphone, a speaker. The electronic components of the electronic module 1 shown in FIG. 1 and FIG. 4 comprises a PCB folded into three dimensional shape. The PCB is flex PCB or rigid PCB. The PCB is shaped is such a way that the shape is suitable for a hearing aid.

Figure 3:
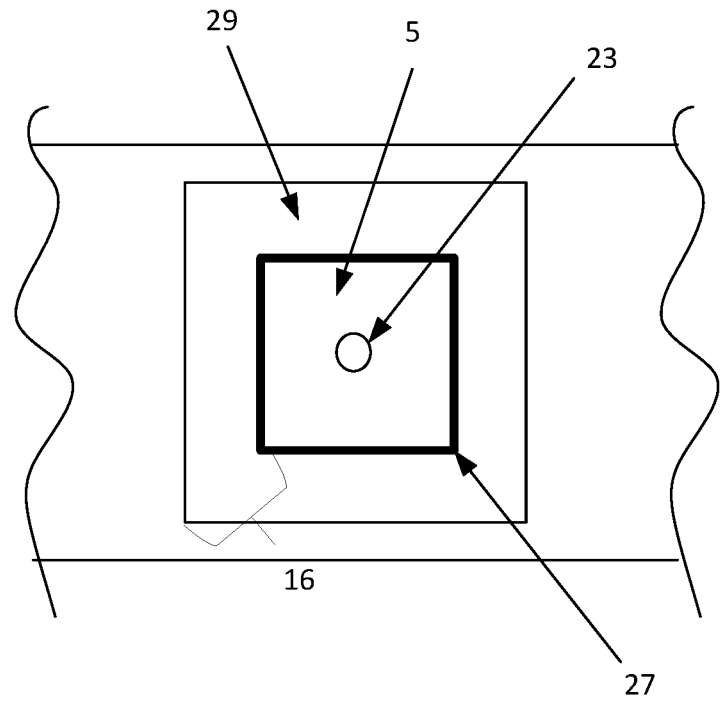
FIG. 3 top view of restricted area of the electronic module.

The restricted area 5 is shown in detail in FIG. 3. The restricted area 5 preferably comprises a functional element 23 of an electronic component 25. The functional element 23 can be for example a microphone inlet and/or connector and/or switch and/or PCB and/or LED and/or lightguide. The restricted area 5 is large enough for allowing access to the functional part 23 in order to use the functional element 23 for intended purpose. Moreover, the restricted area 5 as such can be used for other purposes, for example for mounting a housing or any other element. The functional part 23 is shown in FIG. 3 is for example microphone port or a contact pad. The restricted area 5 is surrounded by a zone 16. The zone 16 is covered by the attaching material. The zone 16 has mold part 29 and an edge 27. The mold part 29 is formed by molding. The zone 16 has an edge 27. The edge 27 faces the restricted area 5. The edge 27 is formed freely by the attaching material. The used term 'freely formed' means that the edge 27 is formed without contacting with molding surface acting on the edge 27. This means that the edge 27 is formed by surface tension, viscosity and density of the embedding material. Therefore, a shape of the edge 27 is often smooth and/or curved, depending on properties of the embedding material 3. The edge 27 is shown in detailed way in cross-section of electronic module 1 shown in FIG. 5.

The electronic module 1 according to the disclosure is manufactured by the method according to the disclosure. The method for manufacturing electronic module 1 for a hearing device comprises providing at least one electronic component 25 of a hearing device. In order to prevent a part surface of the electronic component 25, called restricted area 5 to be covered with an embedding material 3, there is performed an attaching of a mask element 8 to the electronic component 25, as shown in detailed way in FIG. 4.

In order to achieve the electronic module with the restricted area 5, a mask element 8 is attached to the electronic component 25 to that the mask element 8 covers a part of the surface of the electronic component 25. The masked surface comprises an element which needs to be free from the embedding material 3. The masked surface comprises for example a microphone port, a contact pad or any other element. The mask element 8 is attached to the electronic component 25 in order to prevent embedding material 3 to cover at least part of the masked surface called the restricted area 5. The attaching is performed with attaching material, for example with a sealing material, with an embedding material or both. During attaching step the attaching material fills gap between the mask element 8 and a surface of the masked surface, as shown in FIG. 6a-6f. Therefore, the attaching material makes a barrier which prevents embedding material 3 from covering the restricted area 5.

The mask element 8 is shaped so that the mask element 8 provides a capillary stop for attaching material. In order to provide a capillary stop, there is provided a cavity between the mask element 8 and the electronic component 25. In example shown in detail way in FIG. 5, the cavity 17 is provided in the mask element 8. When masking step is performed, the mask element 8 is attached to the electronic component 25 so that the cavity 17 faces the electronic component 25. The cavity 17 can be provided in the electronic component 25, for example by providing a recess in the electronic component 25. In such a case, a mask element can be flat. The attaching of the mask element 8 can be performed together with embedding or prior to the embedding. If the attaching is performed before the embedding, once the mask element 8 is attached to the electronic component 25, is embedded with the embedding material so that the whole surface of the electronic component 25, which is not covered with the at least one mask element 8 is covered with the embedding material 3. The embedding is performed preferably in a mold. The embedding is performed so that the mask element 8 can be removed after embedding. This means that the mask element 8 is preferably at least partially not covered with the embedding material 3 or can be covered but in such a way that removal of the mask element 8 is possible. The mask element 8 can be preferably removed by breaking off the mask element 8. The removal of the mask element 8 can be also performed by cutting the mask element 8 or dissolving.

The mask element 8 can be part of the electronic module. The mask element can be left as a part of the electronic module. An opening in the mask element can be made after embedding is completed thus providing an access to the restricted area 5 arranged below the mask element 8.

The steps of the method for manufacturing electronic module according to the disclosure are shown in FIG. 6a-6f. In the example, the electronic module comprises an opening 30 in a PCB 31. The opening 30 is a functional element 23 which should not be covered with the embedding material 3. A part of the surface of the electronic component 25 comprising the functional element 23 constitutes the restricted area 5. The opening 30 is for example a MEMS microphone inlet. Once a functional element 23 is defined, a mask element 8 is placed over the functional element 23. The mask element 8 comprises a cavity 17. The mask element 8 is placed on a surface of the electronic component 25 so that the cavity 17 faces the functional element 23. The mask element is attached to a surface of the electronic component 25. Preferably, the cavity 17 is arranged substantially centrally opposite the functional element 23. In shown example the restricted area. has no protruding parts.

Figure 5:
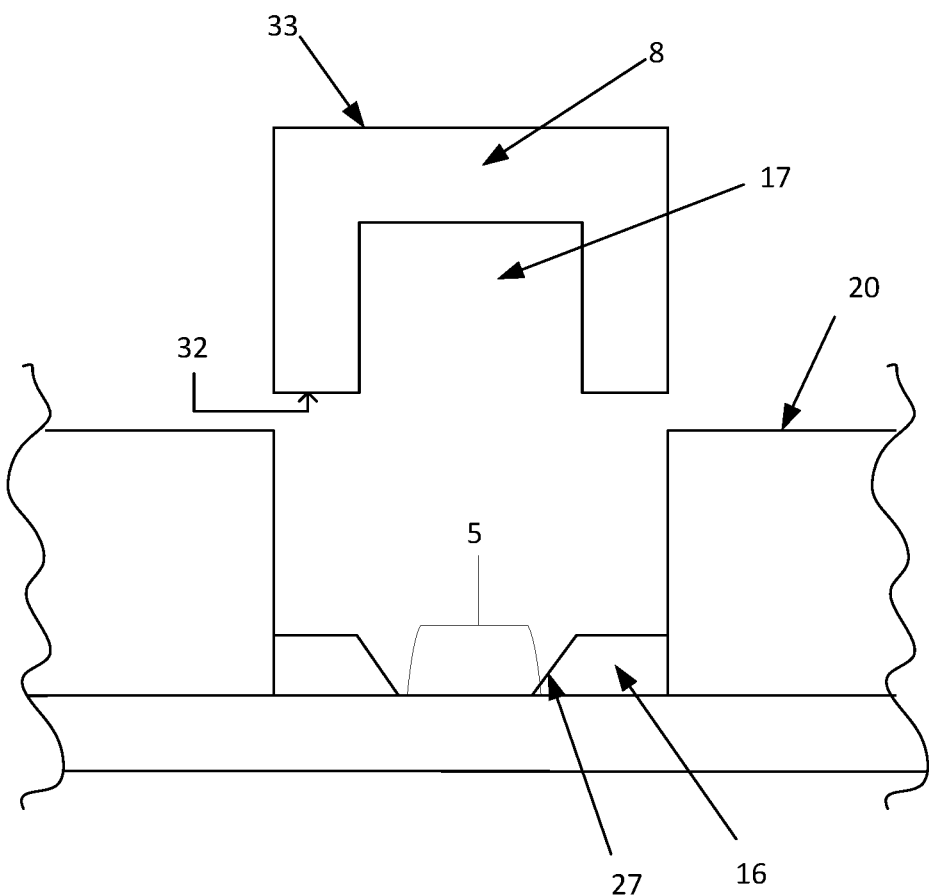
FIG. 5 electronic module with a mask element.

Structure of the mask element 8 will be now presented in detail with respect to FIG. 5. The mask element 8 has an attaching side 32. The attaching side 32 is attached to a mask area of the electronic component 25. The attaching side 32 is shaped so that the attaching side 32 provides a capillary stop for the attaching material. The mask element 8 further comprises a top surface 33. The top surface 33 is arranged substantially opposite with respect to the cavity 17. When embedding step is performed, the top surface 33 of the mask element 8 is preferably at least partially free from embedding material 3, to that the mask element 8 can be removed after the embedding is performed. After removing the mask element 8, a layer of attaching material which remains on surface of the electronic component 25 creates the zone 16.

Figure 6A:
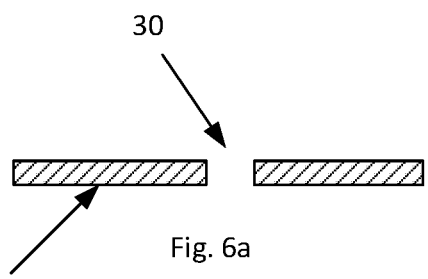
FIG. 6*a-f* steps of masking with a mask element having a cavity.
Figure 6B:
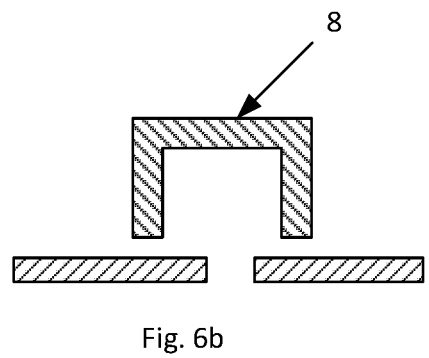
Figure 6C:
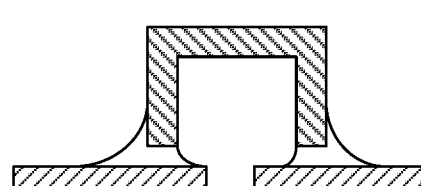
Figure 6D:
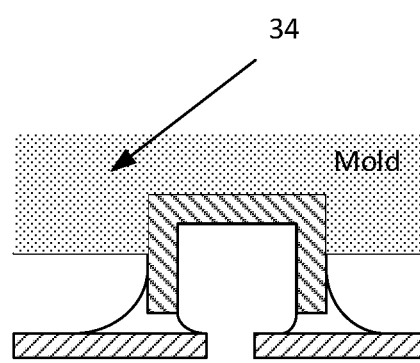
Figure 6E:
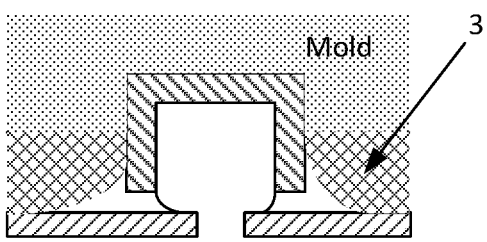
Figure 6F:
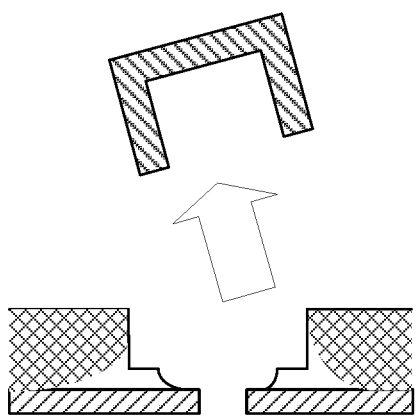
Figure 7A:
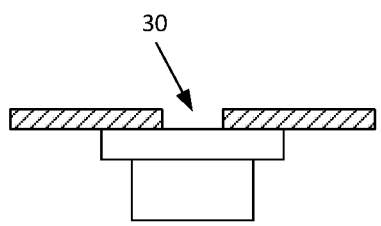
FIG. 7*a-f* steps of masking with a mask element arranged in a mold.
Figure 7B:
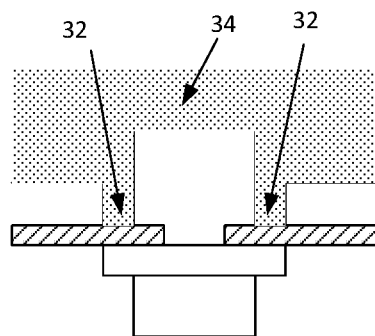
Figure 7C:
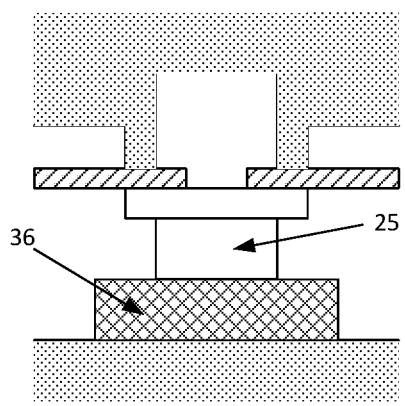
Figure 7D:
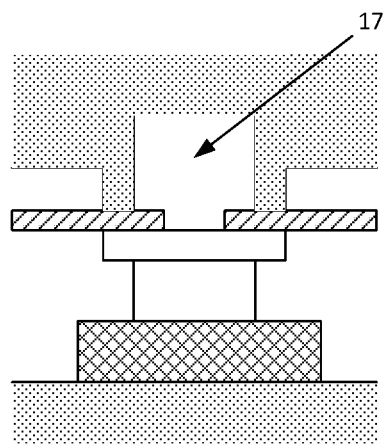
Figure 7E:
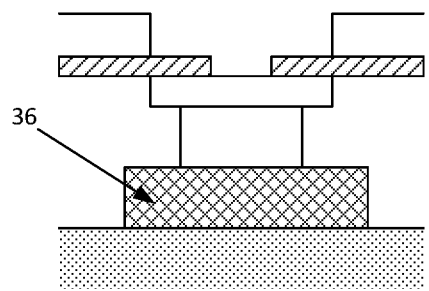
Figure 7F:
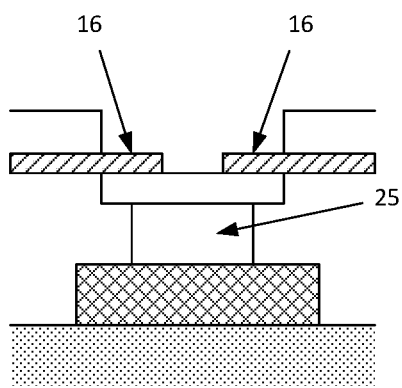

The attaching step is shown in FIG. 6c. During attaching step, the attaching side 32 is attached to the electronic component 25. The attaching material seals the mask element 8 to the electronic component 25 thus providing preferably tight connection between the mask element 8 and the electronic component 25. The attaching material is placed between the mask element 8 and a surface of the electronic component 25. The attaching material may be applied after the mask element 8 is placed on the electronic component 25. The attaching material may be placed on the electronic component 25. The attaching material may be placed on the mask element 8. In the example shown, the attaching material can be placed on the attaching side 32.

Once the mask element 8 is sealed to the electronic component 25 as shown in FIG. 6c, the electronic component 25 with the mask element 8 is placed in the embedding mold 34. The mask element 8 can be used for positioning the electronic component 25 in the mold 34. For example, only the mask element 8 is in contact with the mold 34 when the electronic component 25 with the mask element 8 is placed in the mold 34. In the example shown in FIG. 6d-6f, the mold 34 comprises a recess 35. The recess 35 receives a part of the mask element 8. Preferably, the recess 35 receives at least the top part 33 of the mask element 8 being terminal part of the mask element 8.

When the electronic component 25 with the mask element 8 is placed in the mold cavity, the embedding material 3 is introduced into the mold 34 thus covering the electronic component 25. Then the mold cavity is filled with the embedding material 3 and further the embedding material 3 is cured. After solidifying, for example curing, the embedding material 3 with the electronic component 25, the electronic module according disclosure is achieved. Once the embedding material 3 is solidified, the electronic module 1 can be removed from the mold cavity.

The mold cavity has shape suitable for intended electronic module 1. The shape of internal space of the mold 34, where the electronic component 25 is placed, forms external surface of the electronic module 1.

After solidifying the mask element 8 is removed, thus allowing an access to the functional element 23 which is not covered by the embedding material 3. A part of the masked surface which was arranged below attaching side 32 of the mask element 8 is molded and therefore forms the mold part 29 of the zone 16 covered by the attaching material. An internal rim of the zone 16 forms an edge 27. The edge 27 is formed by the attaching material which was not molded but was freely formed.

An example of the disclosure is shown in FIG. 7a-7f. In this example, a mask element 8 is a part of a mold 34. The mask element 8 protrudes from a wall of a mold 34. The mask element 8 has attaching side 32 and a cavity 17. The mask element 8 is a part of a mold 34 or is a separate part which is inserted and mounted in the mold. The attaching side 32 is attached to the masked surface as descried above. Additionally, the method may comprise using a spring element 36, as shown in FIG. 7c-7f. The spring element 36 is placed opposite to the mask element 8 in the mold. The spring element 36 press the electronic component 25 to the mask element 8 and therefore decreases a distance between the electronic component 25 and the mask element 8. The spring element 36 may be a piece of a foam, a piece of elastomer, a beam sprig, or a spiral spring or a combination of above-mentioned elements. Moreover, a wall of the mold cavity opposing the mask element 8 can have spring properties thus providing a function of a spring element 36. The mask element 8 can be either left in the electronic module 1 after curing the embedding material 3 or removed. The spring element 36 may be reused when molding next electronic component is performed. The spring element 36 can be used also when a mask element 8 is not a part of a mold 34.

Figure 8A:
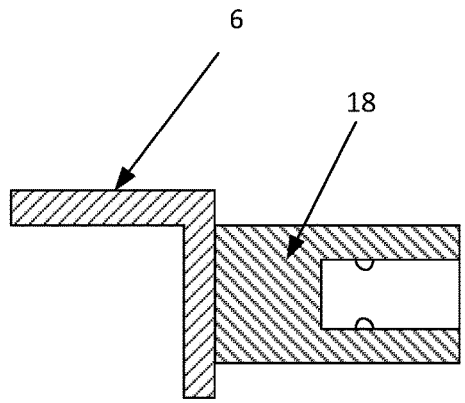
FIG. 8*a-f* steps of masking with a restricted area comprising protruding part, FIG. 9 a device for embedding according to the invention with an object for embedding, FIG. 10 a device for embedding according to the invention with an object for embedding, FIG. 11 a device for embedding according to the invention with an object for embedding.
Figure 8B:
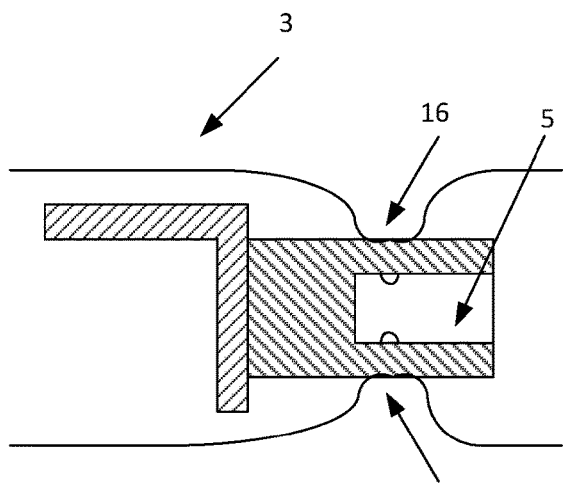
Figure 8C:
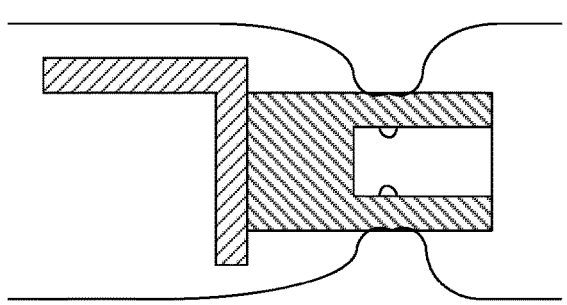
Figure 8D:
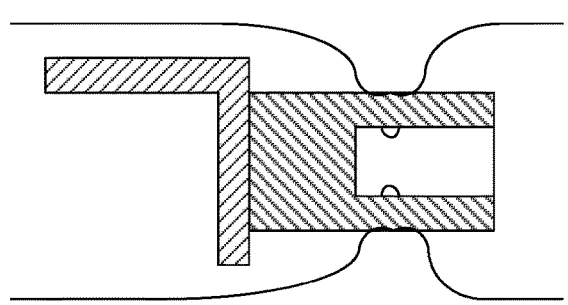
Figure 8E:
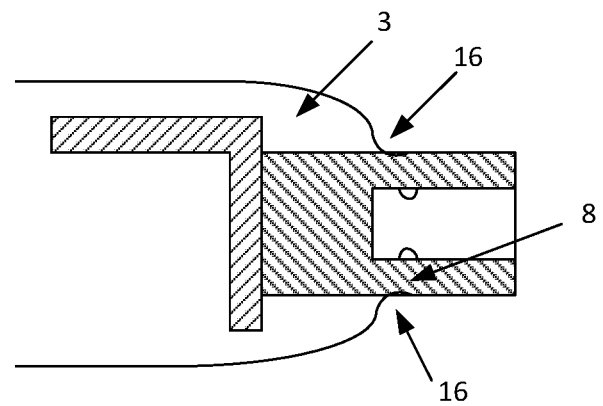

An example of the disclosure is shown in FIG. 8a-8f. In this example a functional element 23 has a protruding part 18. In FIG. 8b the mask element 8 is attached to the protruding part 18, as shown in FIG. 8b. In FIG. 8a-8f the protruding part 18 is a connector. The mask element 8 is placed the protruding part 18 so that an attaching surface 32 of the mask element 8 abuts the protruding part 18. The mask element is sealed to the protruding part 18. The mask element 8 forms a cap around the protruding part 18. The mask element 8 is attached to the protruding part 18 by an attaching material. Additionally, a spring element can be provided in order to decrease a gap between the mask element 8 and the protruding part 18 of the electronic component 25.

Figure 8F:
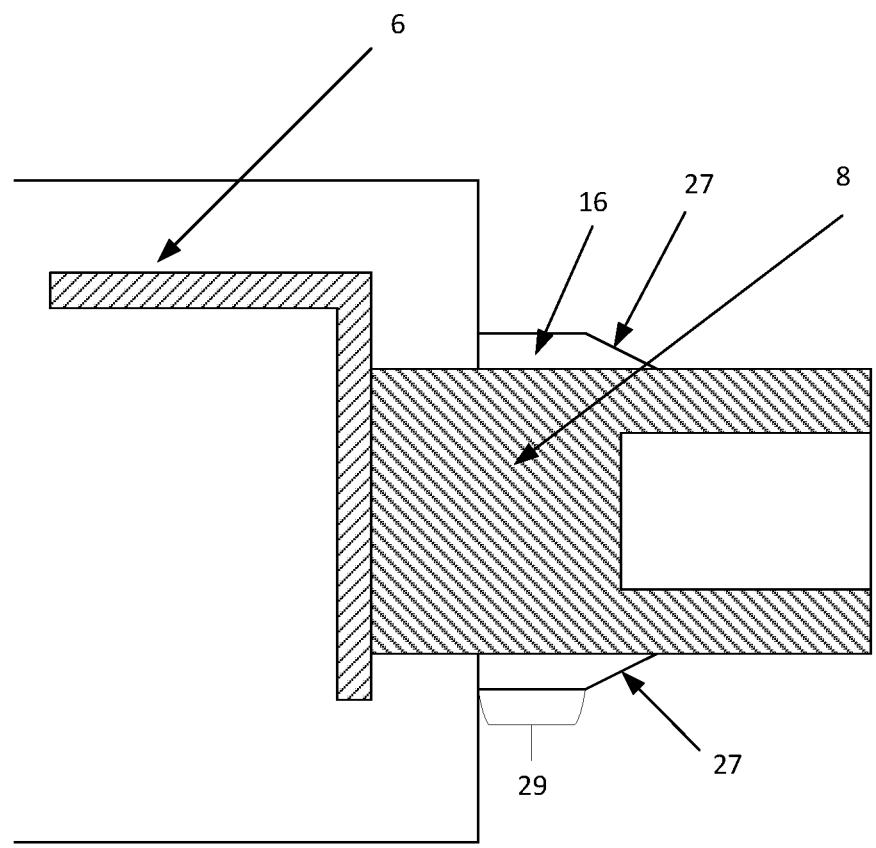

When the mask element 8 is attached to the protruding part 18, the zone 16 can be formed on the protruding part 18 as shown in detail in FIG. 8f. The zone 16 is a layer of attaching material which remains on surface of the electronic component 25 after removing the mask element 8. The zone 16 can be covered with a layer or the attaching material which is thinner than a layer of the embedding material 3 covering the remaining surface of the electronic component 25. The zone 16 has an edge 27 facing the restricted area 5. In this example, the restricted area 5 comprises the protruding part 18.

Figure 9:
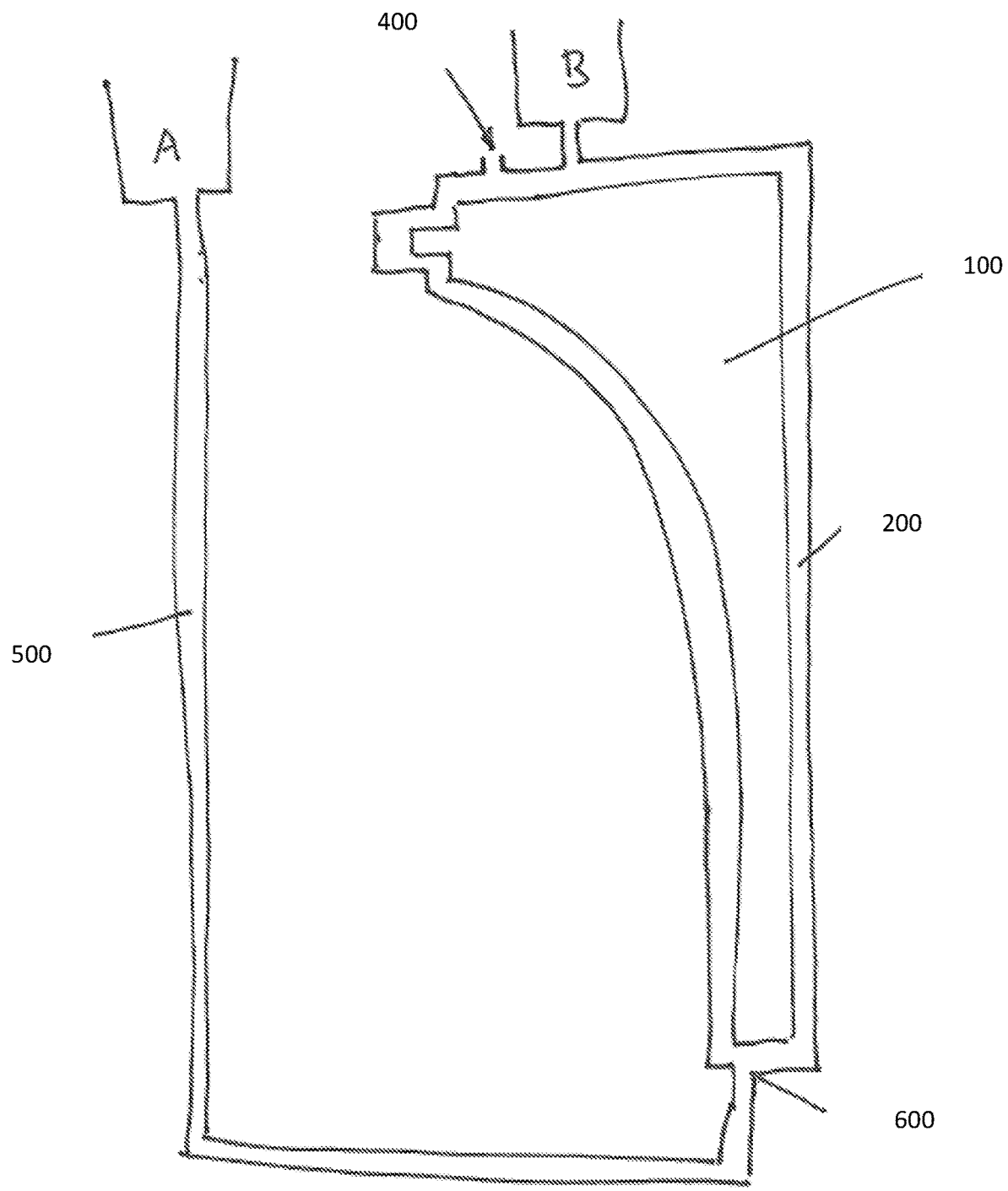

FIG. 9 shows an object 100 for embedding which is in this case an electronic module for a hearing aid comprising an electronic component. The electronic module shown in FIG. 9 is suitable for behind the ear hearing aid. However, the object may be an electronic component for any type of hearing aid, like for example in the ear hearing aid. The electronic module shown in FIG. 9 comprises a microphone, a speaker, a battery, a connector. Thus, in this example of the invention, the object 100 for embedding comprises an electronic components of an a hearing aid. Moreover, an object for embedding may be any comprise at least one electronic and/or non-electronic component. Thus, it is possible to encapsulate the whole electronics of a hearing aid using the method according to the disclosure.

Embedding material is solidifying material. The solidifying material may be for example epoxy, like for example silicon, polyurethane, thermoset material or thermoplastic material. The embedding material has preferably at least one of the following properties: low viscosity before solidification, low shrinkage, is suitable for embedding, UV curing, heat curing, contact to skin, heat conducting, dielectric, transparent, translucent, non-transparent, electrical insulating, electrical conducting, flexible, rigid, low thermal expansion.

FIG. 9 shows an object 100 for embedding placed in a mold cavity 200. The object 100 is placed in the mold cavity 200 and the mold cavity is closed in order to provide a closed volume of the mold cavity 200. When the volume of the mold cavity 200 is closed, a material for embedding is introduced to the volume of the mold cavity 200 and to the reservoir A and B thus performing initial filling of the mold cavity 200 and the reservoir A and B with the solidifying material. The initial filling of the mold cavity 200 is preferably performed up to the moment when the mold cavity 200 is filled with the solidifying material. The inlet 600 of the solidifying material to the mold cavity 200 is preferably arranged so that the solidifying material during filling the mold cavity 200 force out air bubbles which are present in the mold cavity 200. In FIG. 9 inlet 600 of the solidifying material in located at the lowest possible point in the object the object 100 for solidifying. This make gravity/buoyancy of the entrapped air bobbles assist in forcing out the air though the top of the cavity.

During the initial filling of the mold cavity 200 and the reservoir s A, B are filled substantially simultaneously, which means that a part of the amount of the solidifying material is collected in the reservoir A, B. This solidifying material collected in the reservoir A, B is intended for use in supplementary filling of the mold cavity 200 after the initial filling is finished. The initial filling is performed using the initial filling means comprising for example a nozzle for providing the solidifying material. Preferably after the initial filling is finished, the initial filling means are moved to next mold cavity. However, the initial filling means ca be moved to next mold cavity even if the mold cavity is completely filled with the solidifying material. The solidifying material comprises air bubbles, which means the solidifying material which is introduced to the mold cavity 200 is a mix of the material and air bubbles. After the initial filling is finished, the air bubbles which are present in the mold cavity 200 are released or volume wise reduced, so free space/gaps are created inside the mold cavity 200. The air bubbles may be release by vibration, changing temperature, changing pressure or any combinations of the above mentioned factors. The solidifying material for supplementary filling is provided and free volume/space which appears in the mold cavity 200 is be filled without using the initial filling means. The reservoir A, B shown in FIG. 9 is connected with the mold cavity 200 and ensures the availability of extra solidifying material to fill the space/voids.

This allows saving time of using initial filling means and at the same time provides that the mold cavity 200 is fulfilled with the solidifying material when free spaces/gaps are being created. After supplementary filling is completed, the solidifying material is solidified.

The free space in the cavity mold 200 may be created as result of releasing the air bubbles. The free space may be created as result of volume wise reduced of the air bubbles. Volume wise reducing of air bubbles may be result of pressure difference between the initial filling and the supplementary filling and/or initial filling and solidifying stage. For example, the initial filling may be performed in vacuum, for example in a vacuum chamber. After the initial filling is completed, the vacuum may be released. When the vacuum is released, the air bubbles shrink in size since the pressure inside the air bubbles increases from the vacuum to atmospheric pressure.

In FIG. 9 the reservoir A is arranged along a canal 500 for supplying material for initial filling to the mold cavity 200. In this case, the reservoir A is a reservoir placed along the canal 500. However, the reservoir may be smooth widening of the canal 500. Second reservoir B may be arranged for example substantially opposite to the inlet 600 of the canal 500 to the mold cavity 200. Preferably, the second reservoir B is arranged at an extreme point of the mold cavity. The extreme point is a point in the mold cavity which the solidifying material reach thus completing filling of the mold cavity 200 with the solidifying material. Close to the extreme point or adjacent to the extreme point or in the extreme point an inspection hole and/or venting point may be provided.

The at least one reservoir A, B, C may be arranged so that the solidifying material enters the mold cavity gravitationally. However, the solidifying material may be introduced under pressure.

Figure 11:
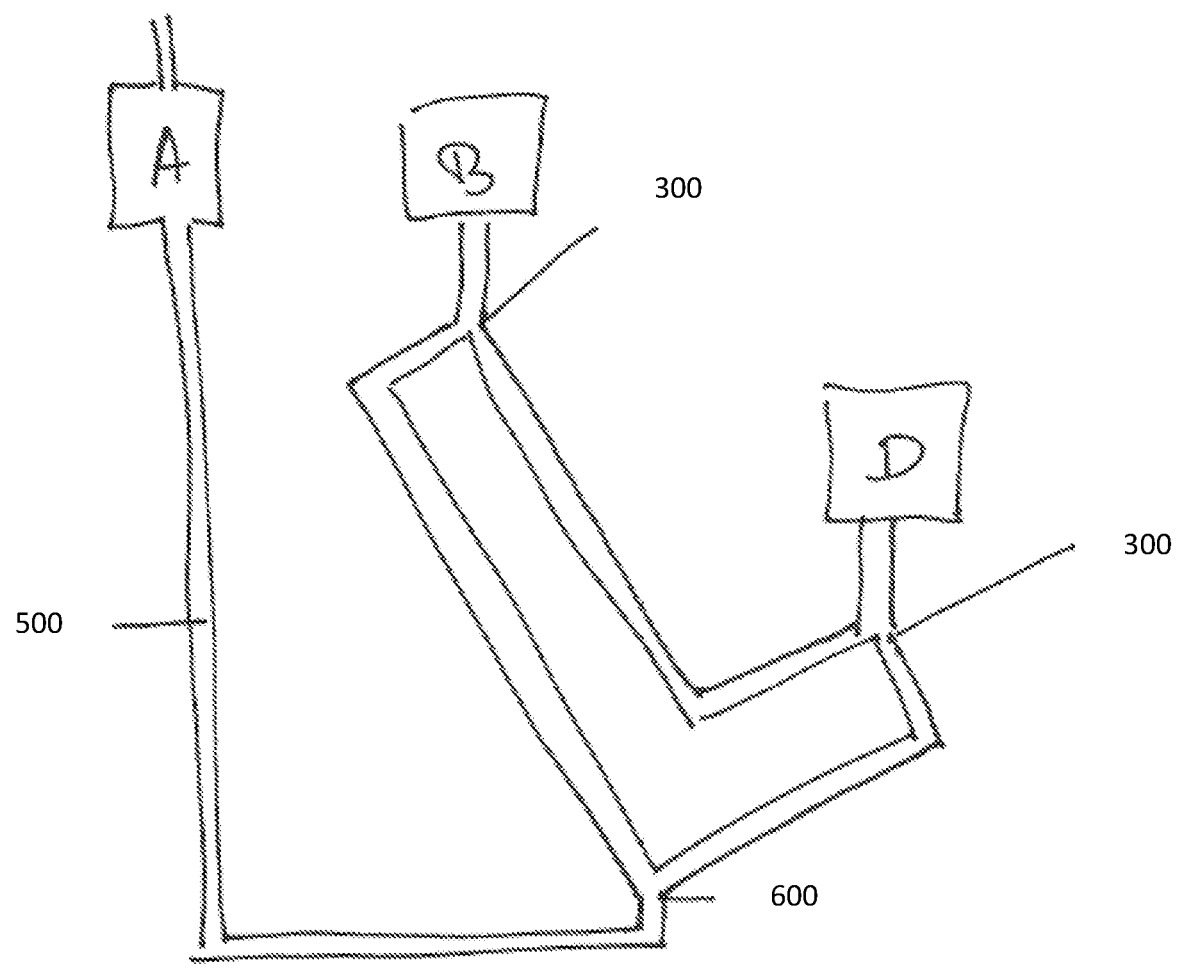

When cavity mold 500 is more complex, as shown in FIG. 11 the device according to the disclosure may comprise more than one extreme point 300 as defined above. The device according to the disclosure shown in FIG. 11 has two reservoirs connected to the extreme points: reservoir B and reservoir C.

Figure 10:
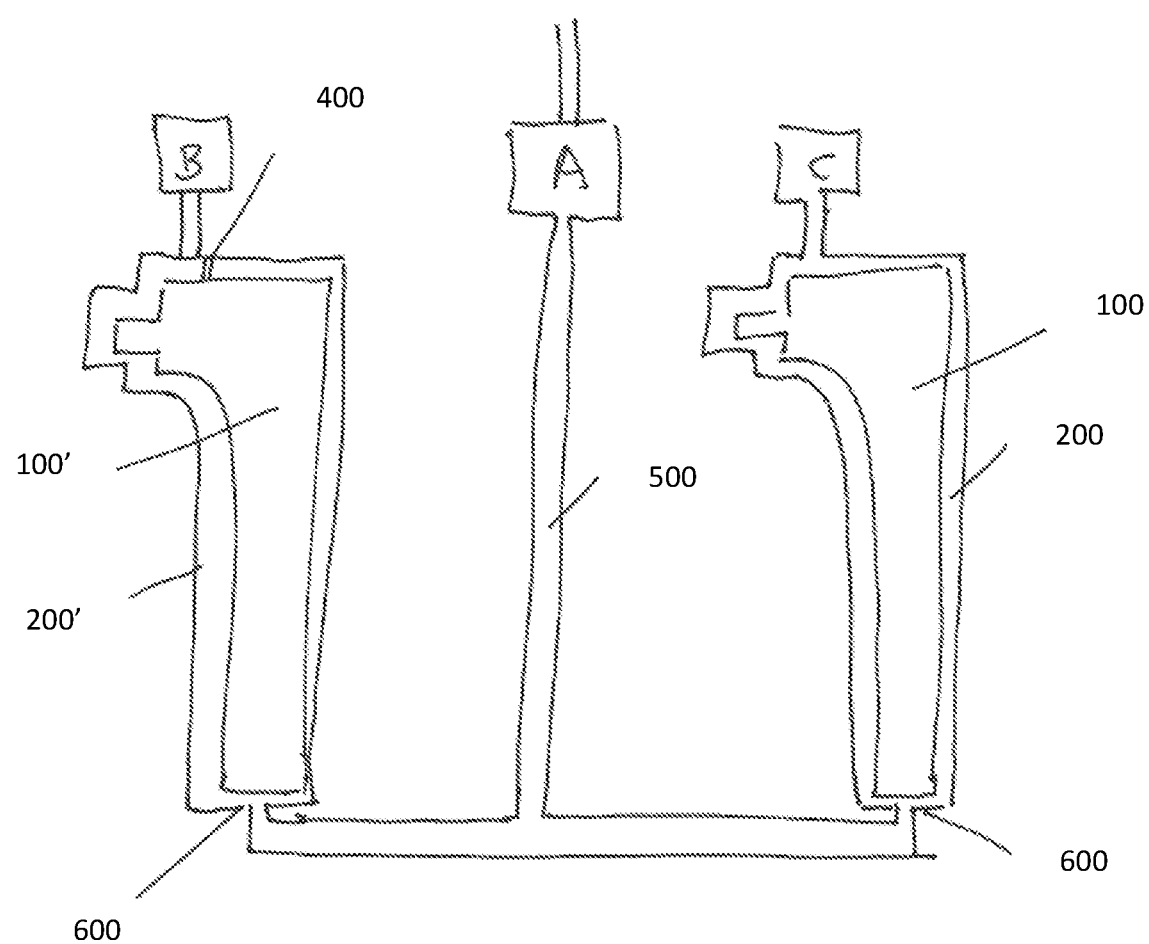

The device according the disclosure may comprise one reservoir for more than one mold cavity 200. In FIG. 10, the reservoir A is arranged along a canal 500 which supplies solidifying material to two mold cavities 200, 200'. In each mold cavity 200, 200', is arranged an object 100, 100', respectively.

The present disclosure relates also to a method where no supplementary filling is performed. In such a case one filling of the mold cavity 200 with solidifying material is performed. The filling is performed under vacuum, for example in a vacuum chamber, with an absolute pressure of e.g. between 0.1 mBar and 1 Bar and fill, for example via gravity or under a pressure below 50 bar with solidifying material. The vacuum is to minimize the presence of air molecules in the cavity entrapping air in bubbles during the filling process. When the vacuum is released, the bubbles will shrink in size. The solidifying can take place in a pressure higher than atmospheric, to squeeze the entrapped air bubbles to an even higher level making the bubbles smaller.

The invention claimed is:

1. A hearing instrument comprising
an electronic module comprising:
   a substrate;
   a plurality of electric components located on the substrate;
   a plurality of restricted areas, wherein each of the plurality of restricted areas is configured to provide an access location to a functional part of one of the plurality of electronic components; and
   a plurality of attachment material zones, each of the plurality of attachment material zones at least partially surrounding one of the plurality of restricted areas;
attachment material located on each of the attachment material zones, wherein the attachment material is configured to attach to a masking material; and
embedding material forming an external shape of the electronic module, wherein the restricted area is free from the embedding material, and wherein the embedding material at least partially covers the plurality of electronic components.

2. The hearing instrument of claim 1, wherein the embedding material is configured to fix the plurality of electronic components to the substrate.

3. The hearing instrument of claim 1, wherein the embedding material is configured to allow for relative movement of one or more of the plurality of electronic components.

4. The hearing instrument of claim 1, wherein the substrate is a printed circuit board (PCB).

5. The hearing instrument of claim 1, wherein the access location is one or more of a port, a microphone inlet, a connector, a switch, a PCB, an LED, and a lightguide.

6. The hearing instrument of claim 1, wherein the access location is a protrusion of one of the plurality of electronic components.

7. The hearing instrument of claim 1, wherein the attachment material zone comprises a curved edge forming a boundary with each of the plurality of restricted areas.

8. The hearing instrument of claim 1, wherein the attachment material zone comprises a tapering edge forming a boundary with each of the plurality of restricted areas.

9. The hearing instrument of claim 1, wherein the attachment material is configured to act as a capillary stop for the attachment material.

10. The hearing instrument of claim 1, wherein embedding material is an epoxy.

11. The hearing instrument of claim 8, wherein embedding material comprises silicon or polyurethane.

12. The hearing instrument of claim 1, wherein embedding material is a UV curable material.

13. The hearing instrument of claim 1, wherein the electronic module does not include a rack.

14. The hearing instrument of claim 1, wherein the electronic module comprises a plurality of surfaces, and wherein the embedding material is located on at least two of the plurality of surfaces.

15. The hearing instrument of claim 1, wherein each of the plurality of attachment material zones fully surrounds one of the plurality of restricted areas.

16. The hearing instrument of claim 1, wherein the embedding material extends away from the substrate farther than the attachment material extends from the substrate.

17. The hearing instrument of claim 1, wherein the embedding material fully covers the plurality of electronic components outside of the restricted areas and the plurality of attachment material zones.

18. The hearing instrument of claim 1, wherein the plurality of attachment material zones are free from the embedding material.

* * * * *